United States Patent
Kim et al.

(10) Patent No.: US 9,070,698 B2
(45) Date of Patent: Jun. 30, 2015

(54) THROUGH-SUBSTRATE VIA SHIELDING

(71) Applicant: International Business Machines Corporation, Armonk, NY (US)

(72) Inventors: Daeik Kim, West Lafayette, IN (US); Chandrasekharan Kothandaraman, Hopewell Junction, NY (US); Chung-Hsun Lin, Hopewell Junction, NY (US); John M. Safran, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 211 days.

(21) Appl. No.: 13/666,319

(22) Filed: Nov. 1, 2012

(65) Prior Publication Data

US 2014/0118059 A1    May 1, 2014

(51) Int. Cl.
*H01L 21/44* (2006.01)
*H01L 23/04* (2006.01)
*H01L 23/58* (2006.01)
*H01L 21/768* (2006.01)
*H01L 23/48* (2006.01)
*H01L 23/498* (2006.01)
*H01L 23/00* (2006.01)

(52) U.S. Cl.
CPC .......... *H01L 23/58* (2013.01); *H01L 21/76898* (2013.01); *H01L 23/481* (2013.01); *H01L 2924/1306* (2013.01); *H01L 23/585* (2013.01); *H01L 24/05* (2013.01); *H01L 24/06* (2013.01); *H01L 2224/0557* (2013.01); *H01L 2224/05624* (2013.01); *H01L 2224/05647* (2013.01); *H01L 2224/05684* (2013.01); *H01L 2224/06181* (2013.01); *H01L 2924/10253* (2013.01); *H01L 2924/3025* (2013.01); *H01L 2924/3512* (2013.01); *H01L 23/49827* (2013.01); *H01L 23/49838* (2013.01); *H01L 2924/00014* (2013.01)

(58) Field of Classification Search
USPC .......................... 257/621, 698; 438/667–673
See application file for complete search history.

(56) References Cited

U.S. PATENT DOCUMENTS

| | | | |
|---|---|---|---|
| 6,873,057 B2 | 3/2005 | Chen et al. | |
| 7,250,683 B2 | 7/2007 | Tsai et al. | |
| 7,268,434 B2 | 9/2007 | Nakashima | |
| 7,288,799 B2 | 10/2007 | Saigoh et al. | |
| 7,692,308 B2 | 4/2010 | Clevenger et al. | |
| 7,701,064 B2 | 4/2010 | Christensen et al. | |
| 7,727,887 B2 | 6/2010 | Christensen et al. | |
| 7,977,798 B2 | 7/2011 | Dertinger et al. | |
| 8,004,084 B2 | 8/2011 | Eda | |
| 8,105,940 B2 | 1/2012 | Christensen et al. | |
| 8,148,824 B2 * | 4/2012 | Lin | 257/774 |
| 8,232,648 B2 | 7/2012 | McGahay et al. | |
| 2004/0262767 A1 * | 12/2004 | Matsuo | 257/758 |
| 2011/0241185 A1 | 10/2011 | Koester et al. | |
| 2011/0298097 A1 * | 12/2011 | Sueyoshi et al. | 257/621 |
| 2012/0080802 A1 * | 4/2012 | Cheng et al. | 257/774 |

* cited by examiner

*Primary Examiner* — Calvin Lee
(74) *Attorney, Agent, or Firm* — Cantor Colburn LLP; Yuanmin Cai

(57) ABSTRACT

A semiconductor apparatus includes a substrate structure including a silicon substrate layer, a conductive through-substrate via extending through the silicon substrate layer. The apparatus further includes a semiconductor device located in the substrate structure and a conductive wall located between the through-substrate via and the semiconductor device. The conductive wall is in electrical contact with the silicon substrate layer.

20 Claims, 14 Drawing Sheets

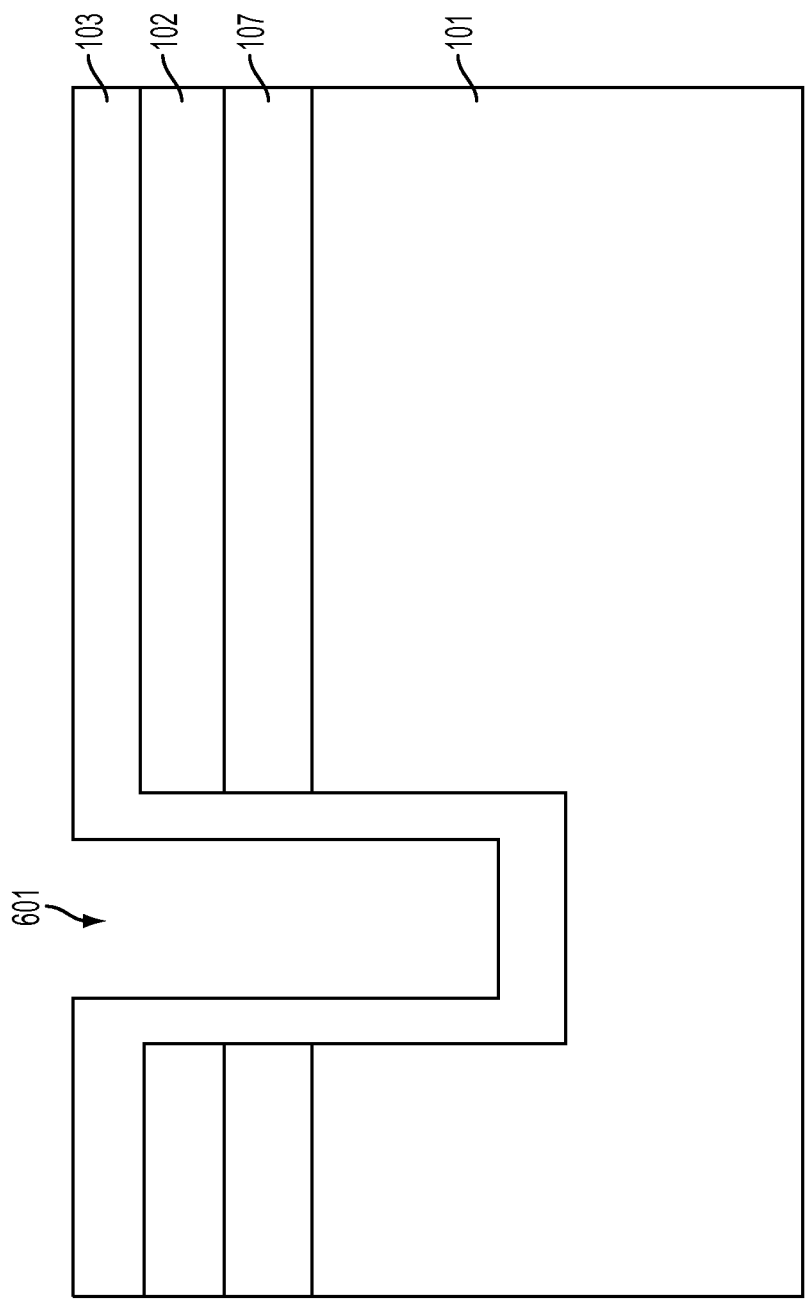

THROUGH-SUBSTRATE VIA SHIELDING

BACKGROUND

The present disclosure relates to through-substrate shielding, and in particular to providing a conductive wall between a through-substrate via and semiconductor elements to prevent the through-substrate via from influencing the semiconductor elements.

In three-dimensional (3D) integration of semiconductor devices, one semiconductor chip may be stacked on top of another. For example, one semiconductor chip may be stacked on one side of a substrate and another on an opposite side. In addition, multiple semiconductor chips may be stacked together without a substrate, multiple substrates may be provided, etc. Semiconductor chips are able to communicate with each other or receive power by way of vias extending through insulating substrates. Through-substrate vias, which may also be referred to as through-silicon vias or TSVs, extend through a substrate from one surface of a chip or substrate to an opposite surface.

While TSVs allow for increased 3D integration of semiconductor chips and devices, one effect of TSVs is that as current flows through a TSV it may couple to semiconductor devices in the substrate through which the TSV passes. Consequently, noise and other interference may hinder the operation of the semiconductor devices.

SUMMARY

Exemplary embodiments include a semiconductor apparatus. The apparatus includes a substrate structure including a silicon substrate layer and a conductive through-substrate via extending through the silicon substrate layer. The apparatus further includes a semiconductor device located in the substrate structure and a conductive wall located between the through-substrate via and the semiconductor device. The conductive wall is in electrical contact with the silicon substrate layer.

Additional exemplary embodiments include a method of forming a semiconductor apparatus. The method includes forming a conductive wall in a substrate, where the substrate includes a substrate structure including a silicon substrate and the conductive wall is in electrical contact with the silicon substrate layer. The method further includes forming a semiconductor device in the substrate structure. The method further includes forming a through-substrate via in the substrate structure on an opposite side of the conductive wall from the semiconductor device, where the through-substrate via separated from the silicon substrate by an insulator.

Additional exemplary embodiments include a semiconductor circuit including a semiconductor apparatus. The apparatus includes a silicon substrate, a conductive through-substrate via extending through the silicon substrate, and an insulator layer located on the silicon substrate and between the silicon substrate and the conductive through-substrate via. The apparatus further includes a semiconductor device located in the insulator layer above the silicon substrate and a conductive wall located between the through-substrate via and the semiconductor device, where the conductive wall is in electrical contact with the silicon substrate. The semiconductor circuit further includes at least one of a power source and a signal source connected to the through-substrate via and a constant voltage source connected to the conductive wall.

Additional exemplary embodiments include a method of using a semiconductor circuit. The method includes connecting a through-substrate via of a semiconductor apparatus to one of a power source and a first signal source. The semiconductor apparatus includes a silicon substrate, an insulator on the silicon substrate, and a semiconductor device in the insulator. The through-substrate via extends through the silicon substrate and is separated from the silicon substrate by the insulator. A conductive wall is located between the through-substrate via and the semiconductor device. The method further includes connecting the conductive wall to a constant voltage source.

Additional features and advantages are realized through the techniques of the present disclosure. Other embodiments and aspects of the present disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter of the disclosure is particularly pointed out and distinctly claimed in the claims at the conclusion of the specification. The forgoing and other features, and advantages of the disclosure are apparent from the following detailed description taken in conjunction with the accompanying drawings in which:

FIGS. 6A to 6H illustrate a method of forming a semiconductor apparatus according to one embodiment of the present disclosure;

FIG. 6A illustrates providing a substrate;

FIG. 6B illustrates forming a hole in the substrate;

FIG. 6C illustrates forming an insulating layer on the substrate;

FIG. 6D illustrates forming a hole to a silicon substrate;

FIG. 6E illustrates forming a preliminary conductive layer;

FIG. 6F illustrates planarizing an upper surface of the substrate and forming a semiconductor device;

FIG. 6G illustrates forming an insulating layer on a back surface of the substrate;

FIG. 6H illustrates forming a through-substrate via; and

DETAILED DESCRIPTION

Typical through-silicon vias are used to connect to DC power, such as voltage supply sources (Vdd, ground), and AC signals, such input/output (I/O) signals. However, the signals and noise generated by the through-silicon vias may couple to nearby semiconductor devices, generating noise and interference in the nearby semiconductor devices. Embodiments of the present disclosure relate to a structure for providing electrical, physical, and/or chemical shielding between a semiconductor device and a through-silicon via or other through-substrate via.

Figure 1:
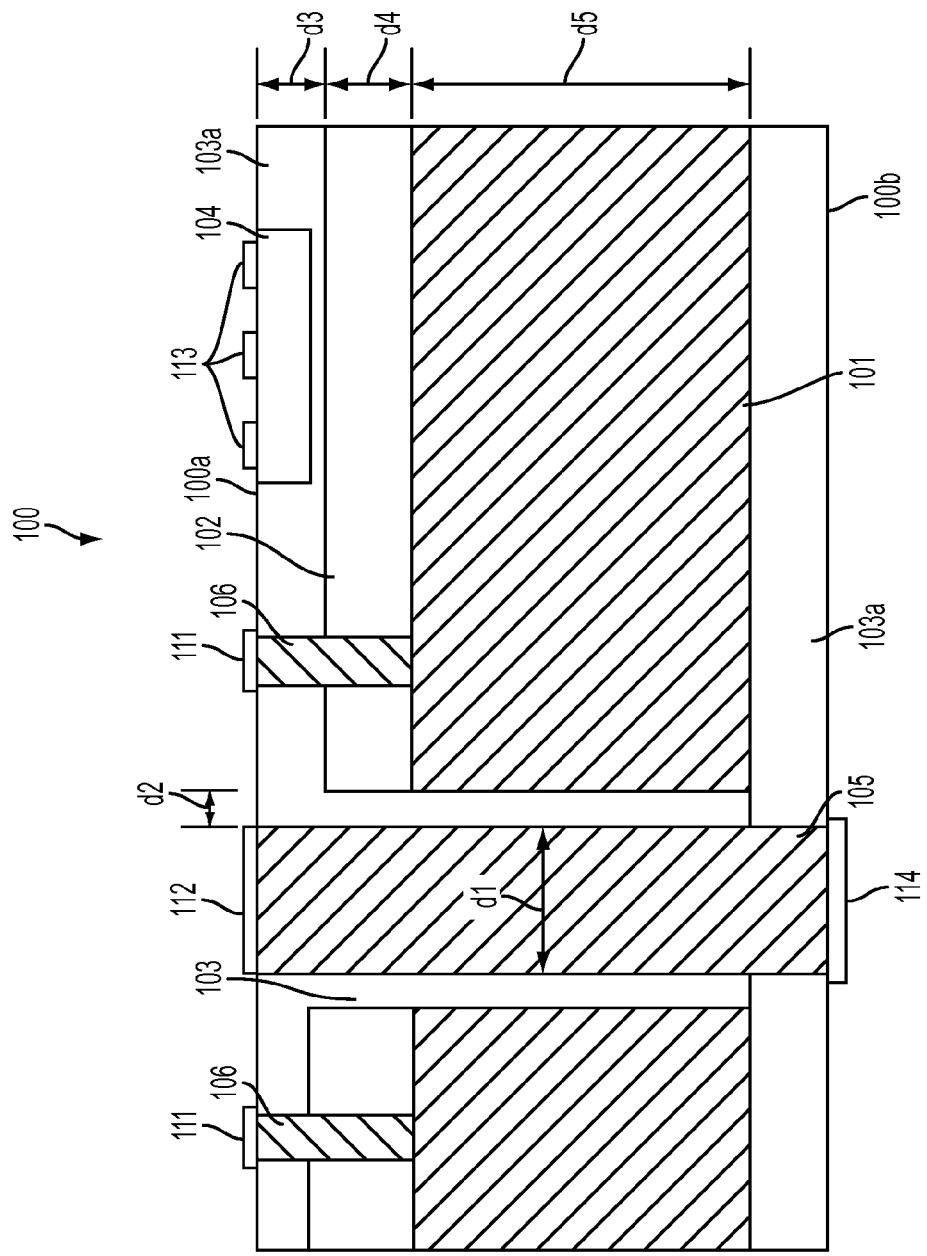
FIG. 1 illustrates a semiconductor apparatus according to one embodiment of the present disclosure.

FIG. 1 illustrates a semiconductor apparatus 100 according to one embodiment of the present disclosure. The apparatus 100 includes a silicon substrate layer 101 (substrate 101), a buried insulator layer 102 and an insulator layer 103. The buried insulator layer 102 may be, for example, a buried oxide (BOX) layer 102, and in the description that follows, the buried insulator layer 102 will be referred to as a BOX layer 102. However, embodiments of the present disclosure encompass any buried insulator layer, and the buried insulator layer need not necessarily be a BOX layer. In addition, embodiments of the present disclosure encompass a semiconductor apparatus having no buried insulator layer. For example, in one embodiment a semiconductor device 104 is formed directly in a substrate layer. Accordingly, in the specification and claims, the term "substrate structure" may refer to a substrate structure having only a silicon substrate layer or it may refer to a substrate structure having multiple layers, such as the silicon substrate layer 101, BOX layer 102 and insulator 103 as illustrated in FIG. 1.

The insulator 103 may be a semiconductor and may be formed of silicon, such as silicon oxide or silicon nitride. The silicon substrate 101 may be formed of pure or doped silicon and may have a conductivity greater than the insulator 103. In embodiments of the present disclosure, the silicon substrate 101 may be electrically conductive.

A semiconductor device 104 is formed in the insulator 103 above the silicon substrate 101 in the depth direction D. In the present specification and claims, the depth direction D refers to a direction into the apparatus 100 from the surfaces 100a and 100b of the apparatus, and the length L or width W directions refer to directions spanning across the surfaces 100a and 100b. Although the surface 100a is referred to as an upper or front surface 100a and the surface 100b is referred to as a lower, bottom, rear, or back-side surface 100b, it is understood that this is for purposes of description only, and embodiments of the present disclosure encompass semiconductor apparatuses having any orientation, such as apparatuses turned ninety degrees relative to the apparatus 100 of FIG. 1, or any other orientation relative to the apparatus of FIG. 1. The semiconductor device 104 may be any device, such as a transistor or group of transistors, such as field-effect transistors (FETs).

In embodiments in which the BOX layer 102 is formed on the silicon substrate 101, the semiconductor device 104 may be formed on the BOX layer 102. The semiconductor device 104 may be formed in the insulator 103, or in a shallow trench insulator 103a, defined by the depth d3. A shallow trench insulator 103a may be made up of the same insulating material as the insulator 103 or of another insulating material.

A through-substrate via 105 is formed in the substrate 101 and the insulator 103. The through-substrate via 105 is formed of a conductive material, such as copper, tungsten, or any other conductive, non-porous material for transmitting power or signals through the substrate 101 and the insulating layer 103.

In embodiments of the present disclosure, a conductive wall 106 is formed between the through-substrate via 105 and the semiconductor device 104. The conductive wall 106 may be formed of any conductive, non-porous material, such as copper or tungsten. The conductive wall 106 extends only part-way into the apparatus 100. In one embodiment, the conductive wall 106 physically and electrically contacts the silicon substrate 101. The conductive wall 106 may contact the silicon substrate 101 without passing through the silicon substrate 101. For example, in one embodiment the conductive wall 106 contacts only a top surface of the silicon substrate 101 in the depth direction D. In another embodiment, the conductive wall 106 may bore into the silicon substrate 101 without passing through the silicon substrate 101.

The apparatus 100 further includes electrical contacts, leads, or pads 111, 112, 113 and 114, which are described in the present specification as electrodes. The electrodes 111 to 114 may be made of metal, such as copper, aluminum, tungsten or any other conductive material. The electrodes 111 to 114 provide electrical contact surfaces for the through-substrate via 105, the conductive wall 106 and the semiconductor device 104, respectively, to contact voltage, current, or other power sources, signal sources, signal receiving devices, or any other electrical power or communications devices or contacts.

In one embodiment, the through-substrate via 105 has a diameter, width or length d1 in a range between 10 micrometers (μm) and 30 μm. In one embodiment, the diameter, width or length d1 is about 20 μm. An insulating gap of the insulator 103 between the silicon substrate 101 and the through-substrate via 105 may have a width or length d2 of between about 0.5 μm and about 1 μm. The depth d3 of the shallow trench insulator 103a may be in a range between about 60 nm and 100 nm. In one embodiment, the depth d3 is about 80 nanometers (nm). The depth d4 of the BOX layer 102 may be in a range between about 100 and 180 nm. In one embodiment, the depth d4 is about 140 nm. A depth d5 of the silicon substrate 101 may be in a range between about 40 and 60 μm. In one embodiment, the depth d5 is about 50 μm.

According to the above-described embodiments, the conductive wall 106 provides electrical shielding of the semiconductor device 104 from the through-substrate via 105. In one embodiment, the electrical connection of the conductive wall 106 with the conductive silicon substrate 101 provides additional electrical shielding of the semiconductor device 104 from the through-substrate via 105. The electrode 111 of the conductive wall 106 may be connected to a constant voltage source, such as a ground potential source or connection, and the electrode 112 of the through-silicon via 105 may be connected to a DC source, such as a power supply, or an AC source or other variable signal source or destination. In addition, the electrodes 113 may be connected to one or more of a power source and a signal source or destination. By maintaining the conductive wall 106 at a constant voltage potential while the through-silicon via 105 and the semiconductor device 104 are connected to one or more of a power source and a signal source or destination, the semiconductor device 104 is electrically shielded from the through-silicon via 105, reducing or eliminating coupling, noise, or interference from the through-substrate via 105.

Embodiments of the present disclosure also encompass a method of forming the semiconductor apparatus 100 in which the conductive wall 106 is formed prior to one or more of the semiconductor device 104 and the through-substrate via 105. In such an embodiment, the conductive wall 106 provides not only electrical shielding, but also physical and chemical shielding, such as from stress or contamination of the insulator 103 as one or the other of the through-silicon via 105 and the semiconductor device 104 is formed. In addition, while FIG. 1 illustrates an embodiment in which the conductive wall 106 physically and electrically contacts the silicon substrate 101, embodiments of the present disclosure also encompass a conductive wall 106 that does not extend to the silicon substrate 101. For example, the conductive wall 106 may extend into the insulating layer 103 to a depth less than the silicon substrate 101, such that a portion of the insulator 103 is between the conductive wall 106 and the silicon substrate 101.

Embodiments of the disclosure also encompass a semiconductor apparatus in which the substrate structure includes only a silicon substrate layer. In such an embodiment, the conductive wall 106 may be formed directly in the silicon substrate layer between the through-silicon via 105 and the semiconductor device 104, which is formed in the silicon substrate layer.

Figure 2:
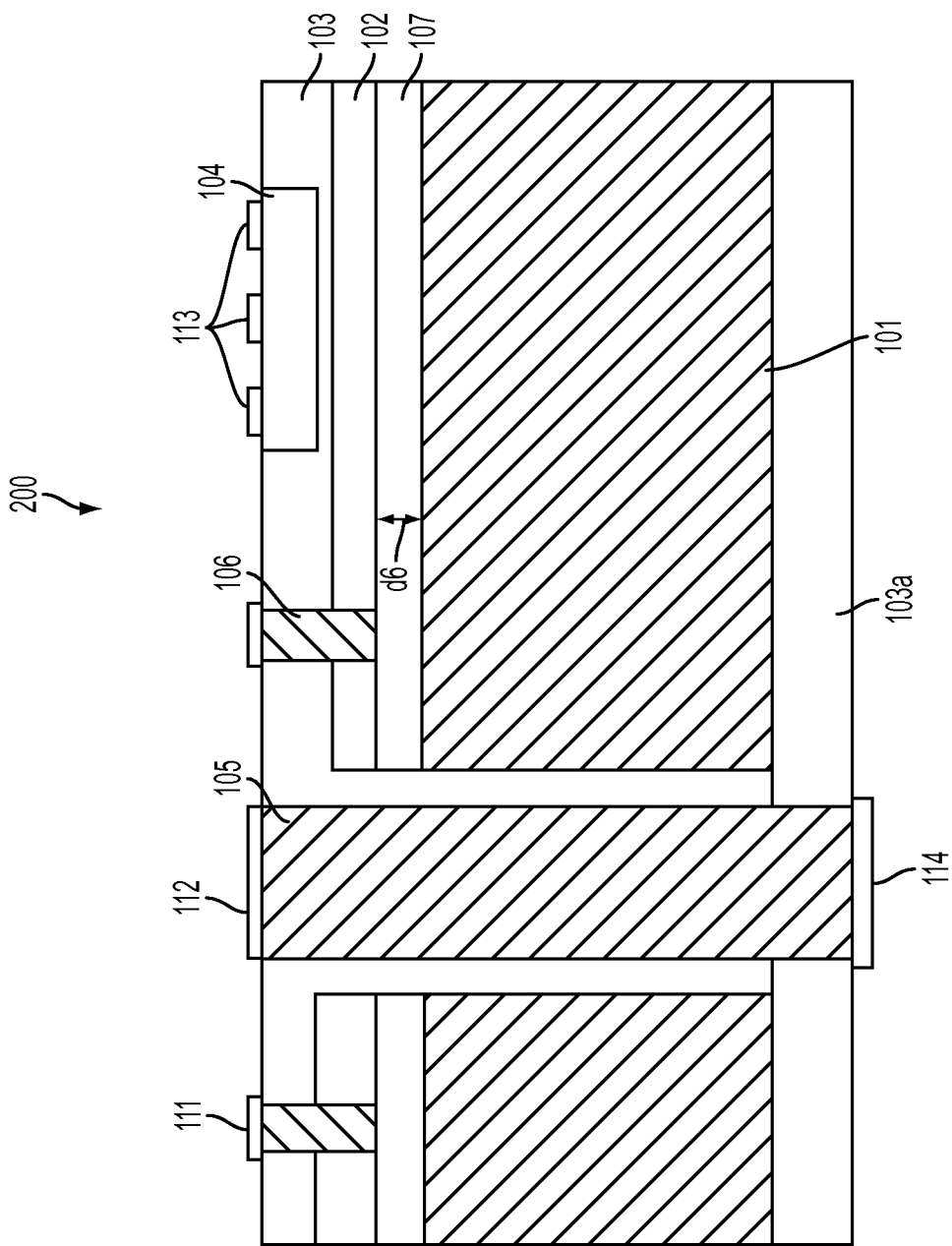
FIG. 2 illustrates a semiconductor apparatus according to another embodiment of the present disclosure.

FIG. 2 illustrates a semiconductor apparatus 200 according to another embodiment of the present disclosure. The semiconductor apparatus 200 is similar to the semiconductor apparatus 100 of FIG. 1, except an epilayer 107 is formed on the silicon substrate 101 between the silicon substrate 101 and the BOX layer 102, or the semiconductor device 104. The epilayer 107 may be a layer formed on the silicon substrate 101 that is doped more than the silicon substrate 101 to be more conductive than the silicon substrate 101. In one embodiment, the epilayer 107 is one of an N+ layer and a P+ layer, depending upon the type of the semiconductor device 104. The epilayer 107 may be formed by any epitaxial growth method capable of doping a surface layer or an embedded layer.

The conductive wall 106 may extend into the insulator 103 to physically and electrically contact the epilayer 107. In one embodiment, the conductive wall 106 contacts an upper surface of the epilayer 107 in the depth direction D. In another embodiment, the conductive wall 106 may bore into the epilayer 107 without passing through the epilayer 107. In yet another embodiment, the conductive wall 106 may contact both the epilayer 107 and the silicon substrate 101. For example, the conductive wall 106 may bore through the epilayer 107, while contacting the epilayer 107, and may either contact an upper surface of the silicon substrate 101 in the depth direction D or may bore into the silicon substrate 101 without passing through the silicon substrate 101. The epilayer 107 may have a depth d6 between about 3 μm and 6 μm. For example, in one embodiment the epilayer 107 has a depth d6 of about 4 μm. In embodiments in which the epilayer 107 is formed on the silicon substrate 101 to have a conductivity greater than the silicon substrate 101, the conductive wall 106 provides improved electrical shielding of the semiconductor device 104 compared to embodiments in which no epilayer 107 is formed.

Figure 3:
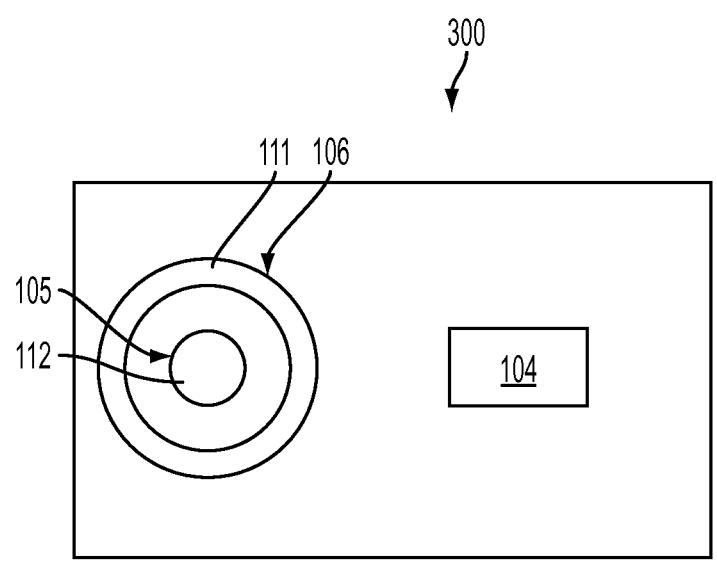
FIG. 3 illustrates a top view of a semiconductor apparatus according to one embodiment.

FIG. 3 illustrates a top view of semiconductor apparatus 300, which may correspond to the semiconductor apparatus 100 of FIG. 1. In FIG. 3, the electrode 111 and the conductive wall 106 are illustrated as entirely surrounding the electrode 112 and the through-substrate via 105, respectively. In some embodiments the conductive wall 106 is a continuous and unitary structure that surrounds the through-substrate via 105 at every point and every angle along a plane defined by the length L and width W of the apparatus 100.

Figure 4:
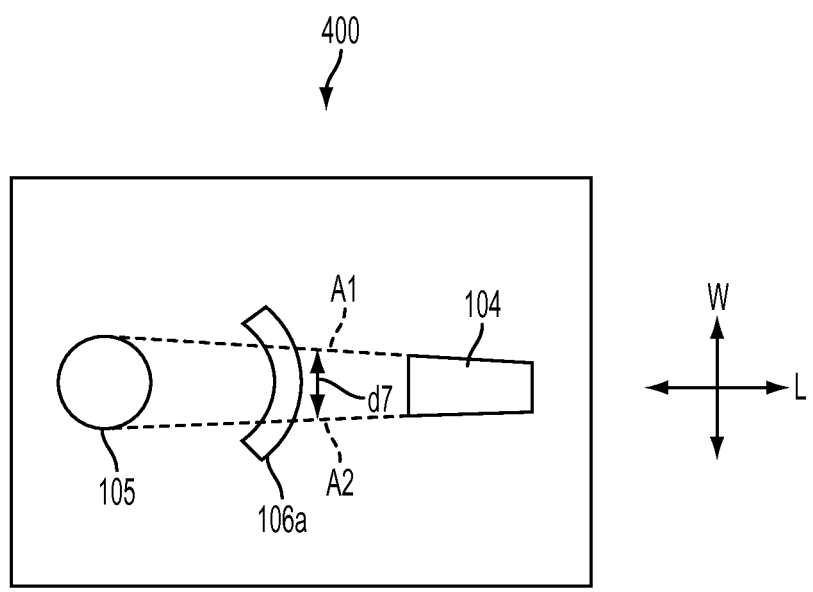
FIG. 4 illustrates a top view of a semiconductor apparatus according to another embodiment.

However, embodiments of the present disclosure also encompass a conductive wall 106 that surrounds only a portion of the through-substrate via 105, or corresponds to only an angle, having an origin at a center of the through-substrate via 105, that is less than 360 degrees. FIG. 4 illustrates a top view of a semiconductor apparatus 400 having a conductive wall 106 that is a segment 106a having a length or a circumference less than 360 degrees. In one embodiment, a length d7 of the wall is less than a length corresponding to a 360 degree wall, but greater than or equal to a length defined by imaginary lines A1 and A2. The first imaginary line A1 may be defined by a first outer edge of the through-substrate via 105 and a first outer edge of the semiconductor device 104. The second imaginary line A2 may be defined by a second outer edge of the through-substrate via 105 opposite the first outer edge and by a second outer edge of the semiconductor device 104 opposite the first outer edge. In other words, the conductive wall 106 may have a length or width less than 360 degrees, less than 180 degrees, or even less than 90 degrees. The length or width of the conductive wall 106 may be configured such that every imaginary line along a length/width (L/W) plane intersecting both the through-substrate via 105 and the semiconductor device 104 passes through the conductive wall 106a.

Figure 5A:
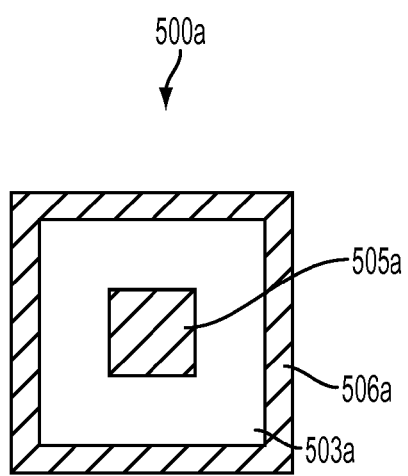
FIG. 5A illustrates a top view of a semiconductor apparatus according to another embodiment.
Figure 5B:
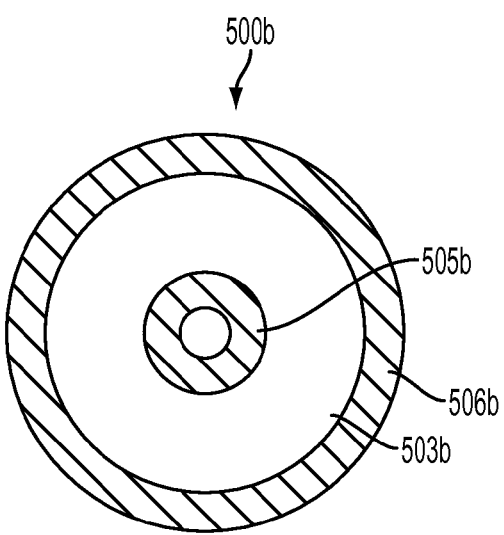
FIG. 5B illustrates a top view of a semiconductor apparatus according to yet another embodiment.

While FIG. 3 illustrates an embodiment in which the through-substrate via 105 has a cylindrical shape, or a circular cross-sectional shape, and the conductive wall 106 has an annular shape, embodiments of the present disclosure encompass through-substrate vias 105 and conductive walls 106 of any shape. For example, FIG. 5A illustrates a top-view cross-section of a portion of a semiconductor apparatus 500a having a through-substrate via 505a having a square shape, a conductive wall 506a having a square shape, and the insulator 503a between the through-substrate via 505a and the conductive wall 506a. In another example, FIG. 5B illustrates a semiconductor apparatus 500b having a through-substrate via 505b having an annular shape, a conductive wall 506b having an annular shape, and the insulator 503b between the through-substrate via 505b and the conductive wall 506b. FIGS. 1 through 5B are provided merely as examples of shapes of a through-substrate via and conductive wall. Embodiments of the present disclosure encompass any shape of a through-substrate via and a conductive wall.

FIGS. 6A to 6H illustrate a method of forming a semiconductor apparatus 200 according to an embodiment of the present disclosure. FIG. 7 is a flowchart of a method of forming the semiconductor apparatus 200 according to an embodiment. A method of forming the semiconductor apparatus 200 will be discussed with reference to FIGS. 6A to 6G and 7.

Figure 6A:
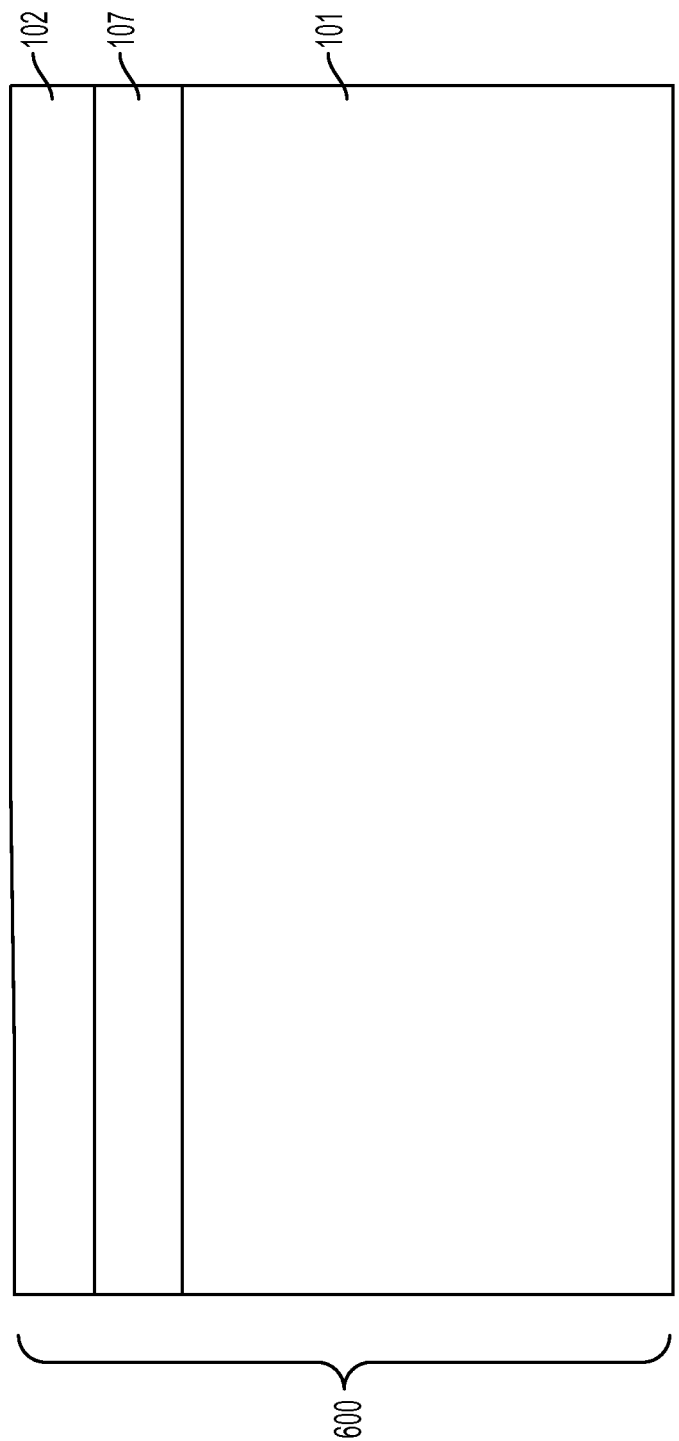
Figure 6B:
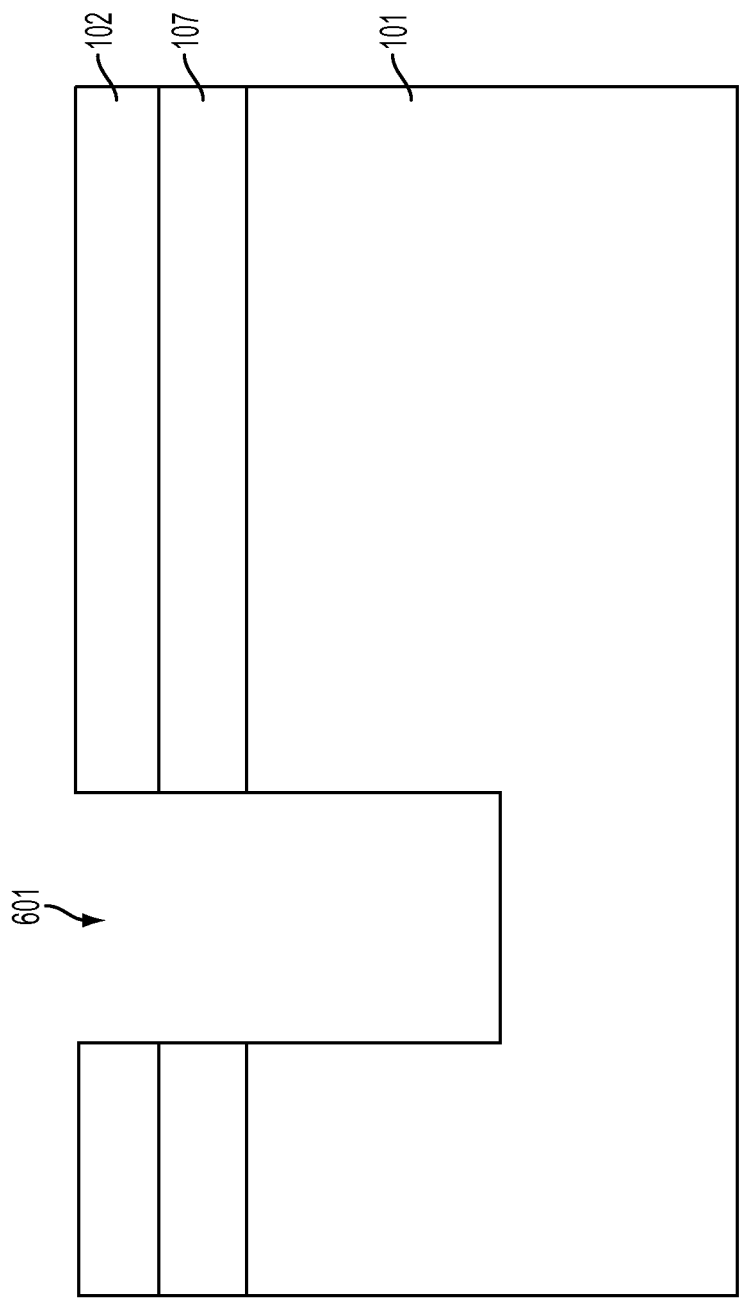
Figure 7:
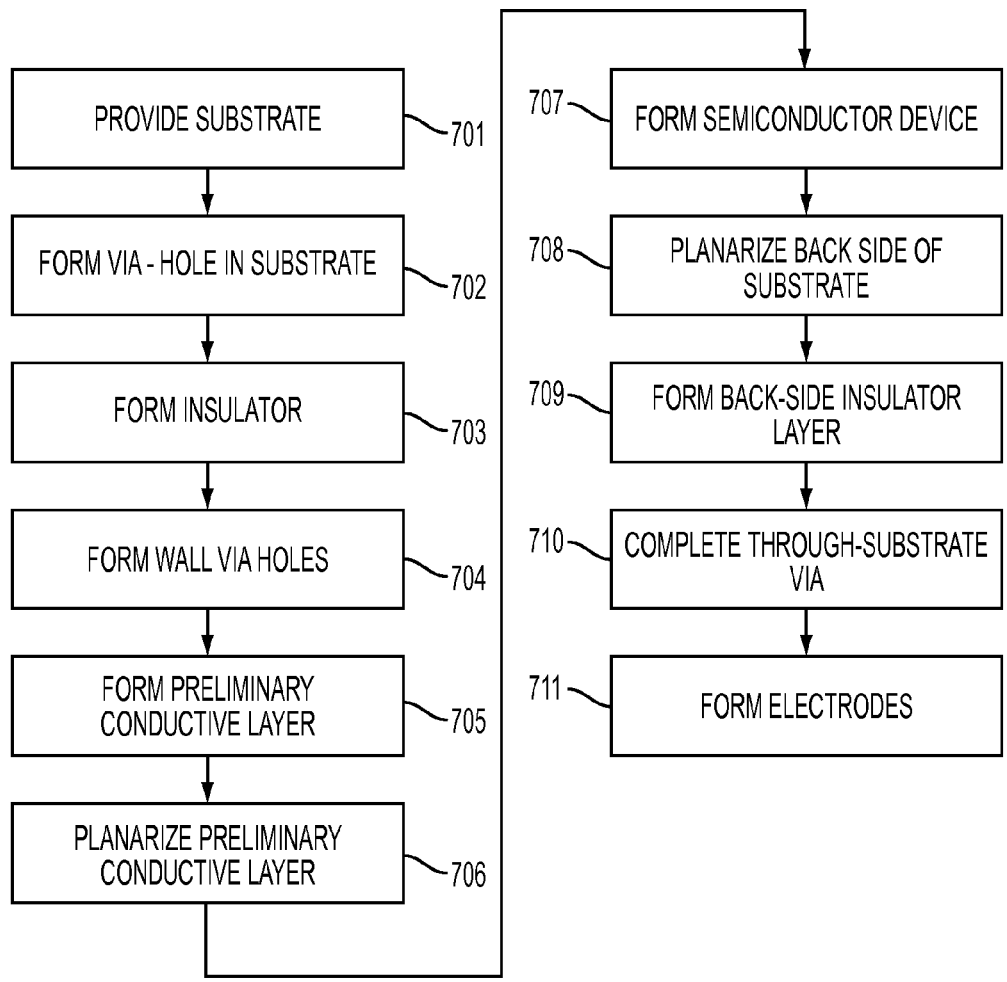
FIG. 7 illustrates a flowchart of a method for forming a semiconductor apparatus according to an embodiment of the disclosure.

Referring to FIGS. 6A and 7, in block 701 (of FIG. 7) a substrate 600 is provided. The substrate 600 may include, for example, a silicon substrate 101, an epilayer 107 formed on the silicon substrate 101, such as by epitaxial growth, and an insulating layer 102 formed on the epitaxial layer 107. In block 702 and FIG. 6B, a preliminary via-hole 601 is formed in the substrate 600. The preliminary via-hole 601 may extend into the silicon substrate 101 without passing through the silicon substrate 101.

In FIG. 6C and block 703, an insulator 103 is formed on the substrate 600. The insulator 103 may be formed to cover an upper surface of the insulating layer 102 and sides of the preliminary through-hole 601. The insulator 103 may be a semiconductor material, such as a silicon-based material, having a conductivity less than the silicon substrate 101. The insulator 103 may be, for example, silicon nitride or silicon oxide, and may be formed by deposition or any other method.

Although FIGS. 6B and 6C illustrate the insulating layer 102 being formed prior to the insulator 103 being deposited, in some embodiments, the insulator 103 may be formed directly on the epilayer 107, or the silicon layer 101.

Figure 6D:
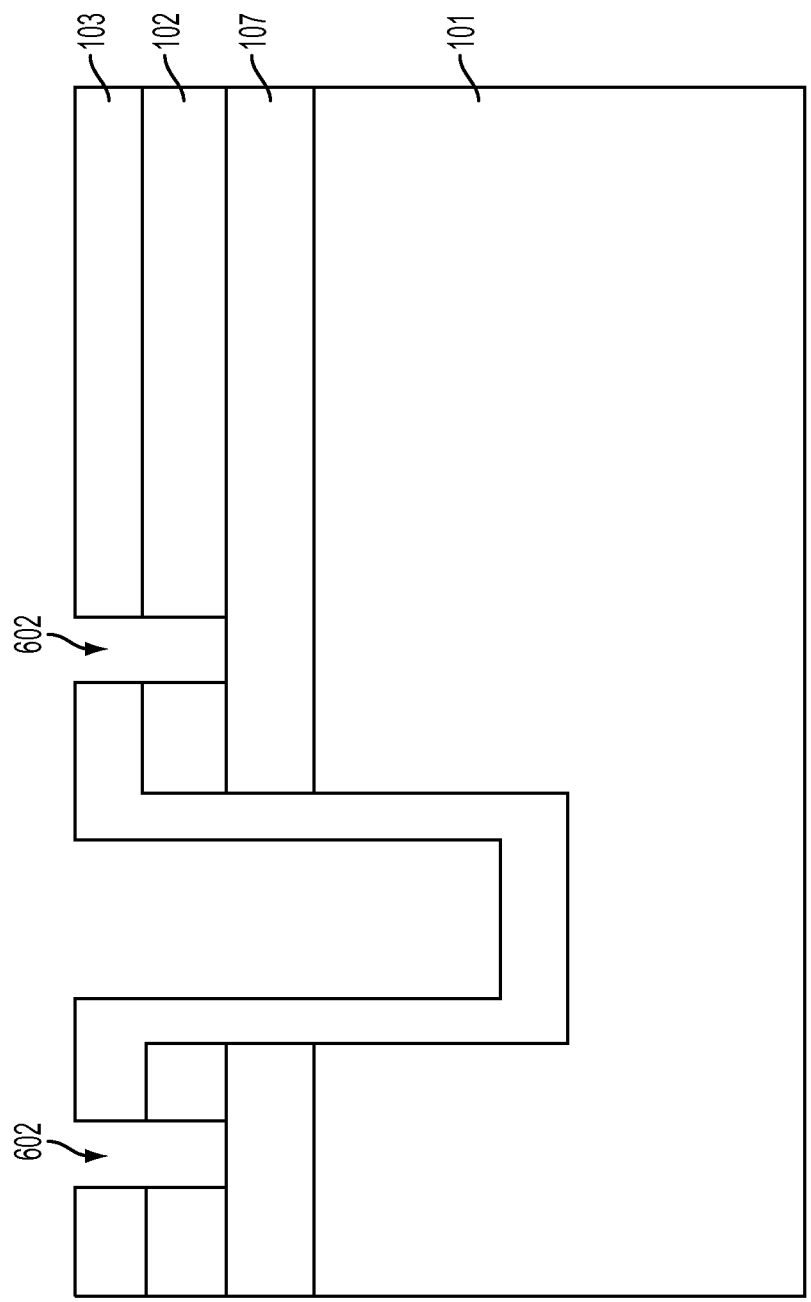
Figure 6E:
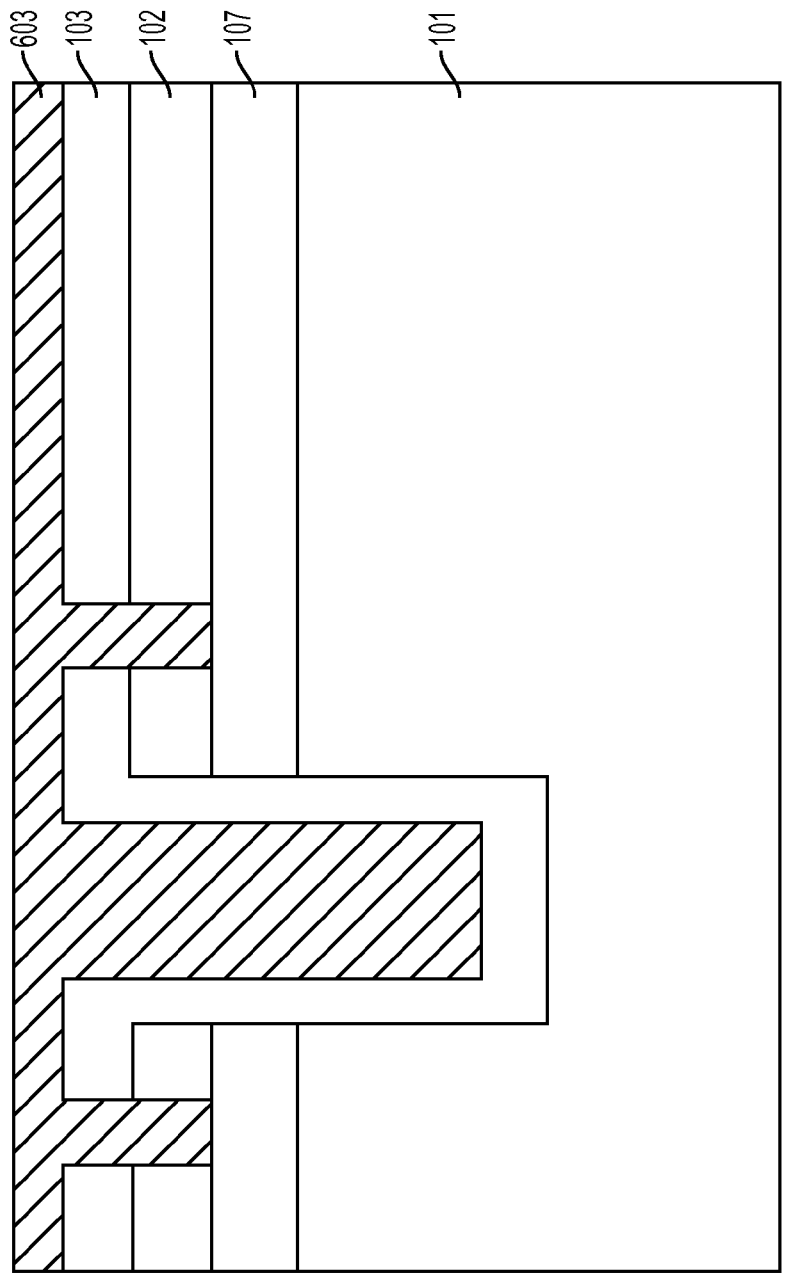

In FIG. 6D and block 704, wall via holes 602 are formed in the insulator 103 and the insulating layer 102. The wall via holes 602 may be formed by etching or any other process. The wall via holes 602 may expose the epilayer 107 or the silicon substrate 101. In FIG. 6E and block 705, a preliminary conductive layer 603 is formed. The preliminary conductive layer 603 may be formed by deposition or any other method. The preliminary conductive layer 603 may comprise tungsten, copper, or any other conductive and non-porous material.

Figure 6F:
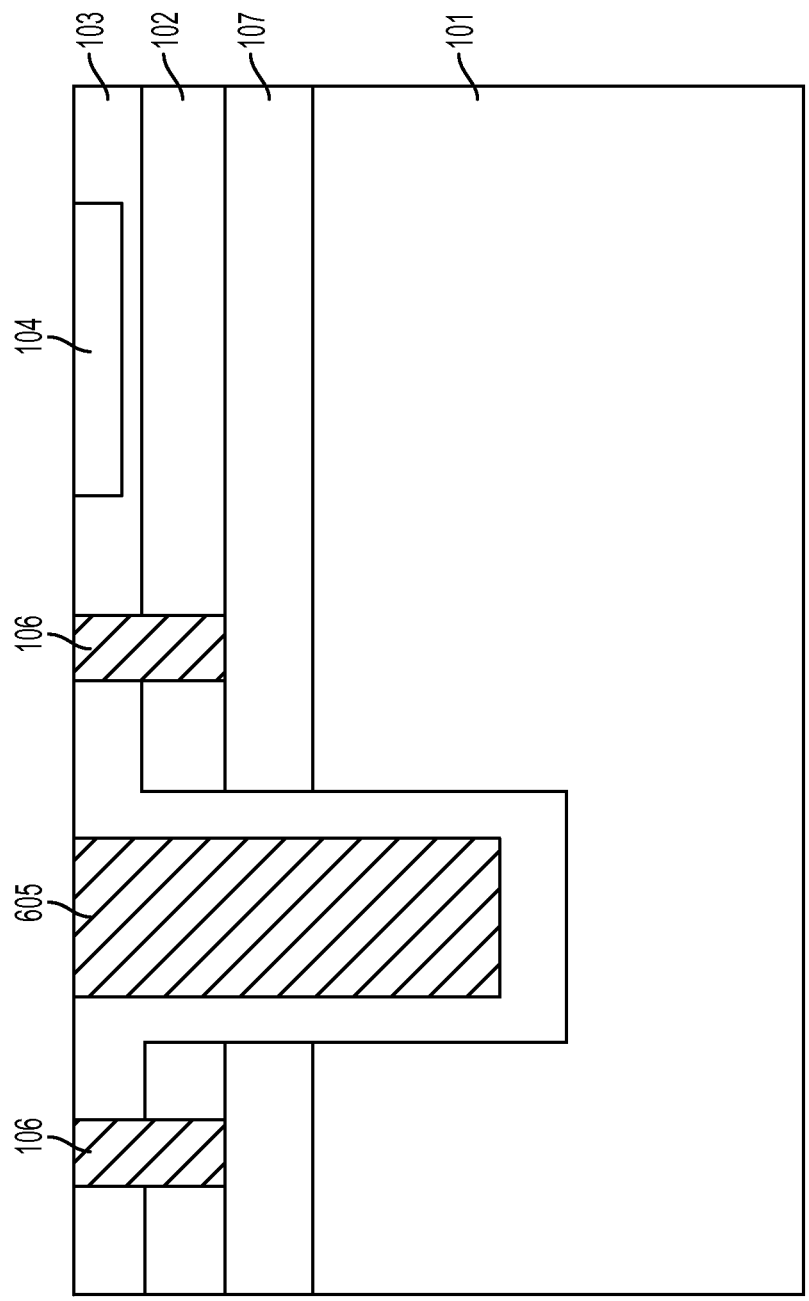

In FIG. 6F and block 706, a top or upper surface of the substrate 600 is planarized to remove a portion of the preliminary conductive layer 603, so that only portions of the preliminary conductive layers 603 corresponding to the preliminary through-substrate via 605 and the conductive wall 106 are exposed. In addition, in block 707, a semiconductor device 707 is formed in the insulator 103. In one embodiment, the semiconductor device 104 is formed by etching a trench in the insulator 103 and forming the semiconductor device 104 in the trench. The semiconductor device 104 may be formed by any method in which a portion of the semiconductor device is embedded in the insulator 103 or adjacent to the insulator 103. The semiconductor device 104 may include, for example, one or more transistors, such as FETs, or any other semiconductor structures for transmitting signals.

Although FIGS. 6E and 6F illustrate the conductive wall 106 being formed simultaneously with, and comprising the same material as, the preliminary through-substrate via 605, embodiments of the present disclosure encompass additional processes which would form the conductive wall 106 separately from the preliminary through-substrate via 605. In addition, the conductive wall 106 may be formed of a material different from the preliminary through-substrate via 605. For example, in one alternative embodiment, a first insulator layer may be formed on the substrate 600 of FIG. 6A, the conductive wall 106 may be formed to pass through the first insulator layer, a preliminary through-hole may be formed, a second insulator layer may be formed on the first insulator layer, the preliminary through-substrate via may be formed, and both the first and second insulator layers may be planarized to form the preliminary through-substrate via 605 and the conductive wall 106, which may comprise different materials. In addition, forming the conductive wall 106 prior to the preliminary through-substrate via 605 may provide additional protection of the semiconductor device 104 from mechanical strain and chemical contamination resulting from the formation of the through-substrate via 105.

Figure 6G:
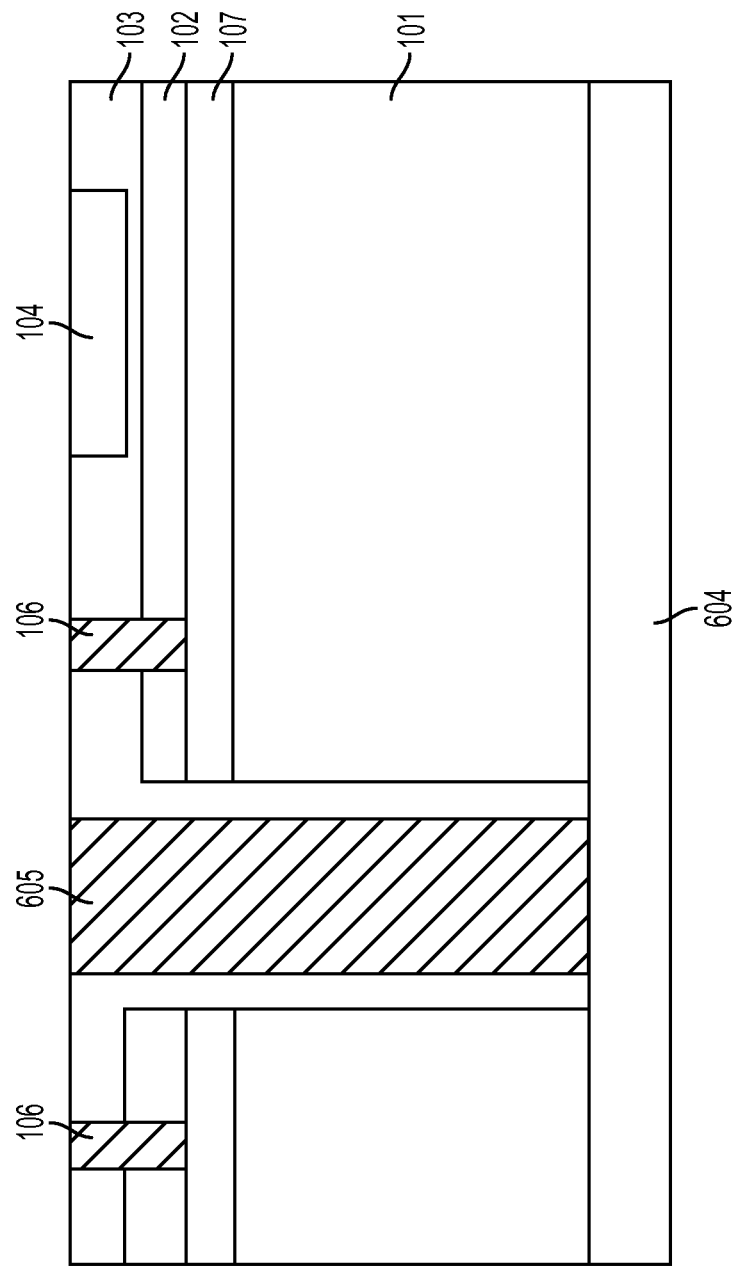

In FIG. 6G and block 708, a back side of the substrate 600 is planarized to expose the bottom end of the preliminary through-substrate via 605. In block 709, a preliminary back-side insulator layer 604 is formed. The preliminary back-side insulator layer 604 may be formed of a same material as the insulator 103.

Figure 6H:
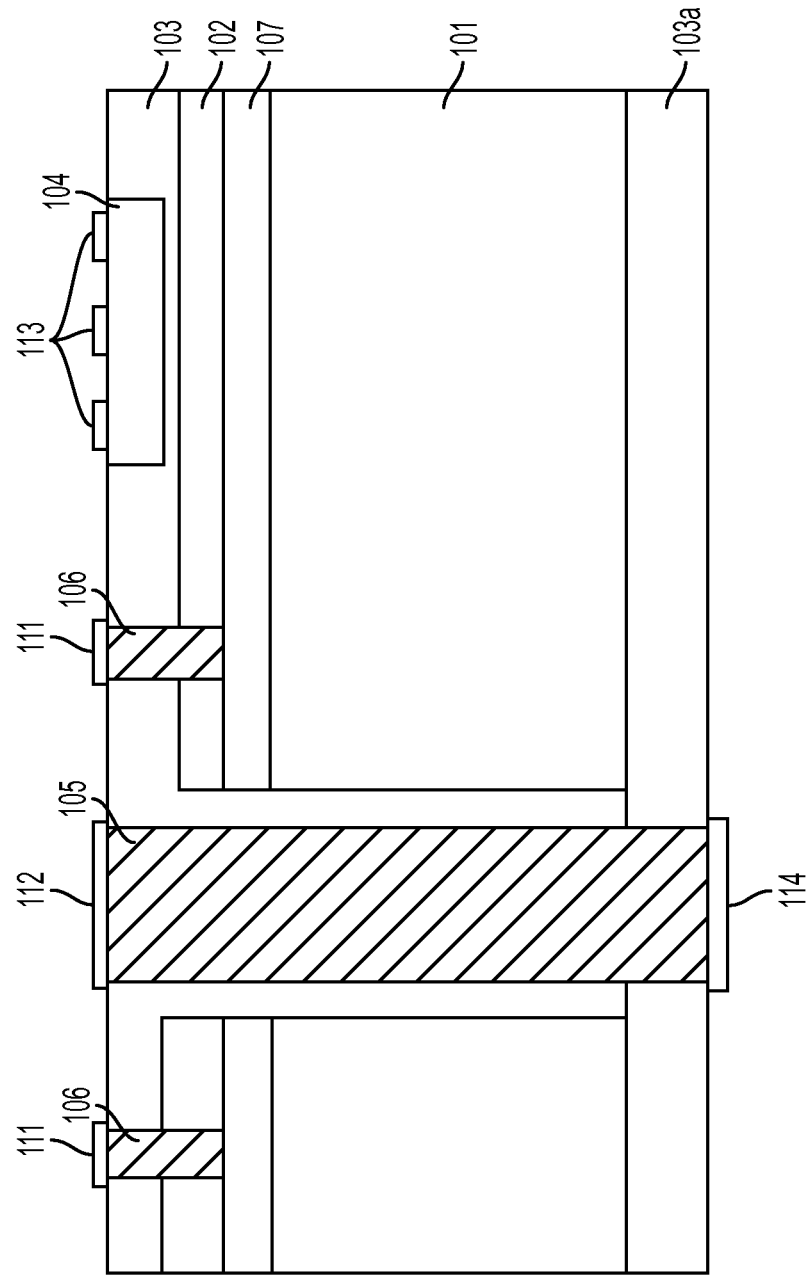

In FIG. 6H and block 710, the through-substrate via 105 is formed. For example, a hole may be etched in the preliminary back-side insulator layer 604 of FIG. 6G, and the hole may be filled with the same conductive material as the preliminary through-substrate via 605. In block 711, electrodes 111, 112, 113 and 114 are formed on the conductive wall 106, both ends of the through-substrate via 105 and on the semiconductor device 104. The electrodes may be formed to permit or facilitate transmitting and receiving of AC and DC voltages and signals. In particular, the conductive wall may be connected to a constant voltage source, such as a ground source, and the through-substrate via and semiconductor device may be connected to AC and DC voltage sources or signals.

While the method of FIGS. 6A to 6H and FIG. 7 has been illustrated in a particular order, embodiments of the present disclosure encompass methods in which one or more of the blocks of FIG. 7 are executed in a different order. For example, in one embodiment one of the formation of the through-substrate via and the semiconductor device may occur prior to forming the conductive wall. In another embodiment, no epilayer is formed on the silicon substrate. Other variations are encompassed within the scope of embodiments of the present disclosure.

As illustrated above, by forming a conductive wall between a semiconductor device and a through-substrate via, the conductive wall may shield the semiconductor electrically, mechanically, and chemically from the through-substrate via.

In embodiment in which the conductive wall is formed prior to one or both of the through-substrate via and the semiconductor device, the conductive wall may prevent the semiconductor device from being contaminated by chemicals injected into an insulation layer by formation of a through-substrate via. In addition, the conductive wall may protect the semiconductor device from mechanical stress and cracks that may be caused during formation of the through-substrate via or through interaction of external devices or objects with the through-substrate via.

In simulation test examples of embodiments of the present disclosure, coupling between the through-substrate via and a semiconductor device was reduced when a conductive wall was introduced between the through-substrate via and the semiconductor device. Coupling was reduced further when the conductive wall contacted an embedded silicon substrate having a conductivity greater than a conductivity of an insulator substrate. In addition, when no conductive wall was present, coupling increased with the formation of an epilayer on the silicon substrate, where the epilayer was doped to have a conductivity greater than the silicon substrate. However, coupling between the through-substrate via and the semiconductor device was reduced lower than when no epilayer was present when the conductive wall was introduced and connected to the epilayer.

A semiconductor apparatus and circuit according to embodiments of the present disclosure may be part of any semiconductor machine, device, apparatus, or system, such as memory devices, logic devices, other processing devices, switching devices, computers, appliances, vehicles, and any other object or structure utilizing 3D integration of semiconductor devices or chips.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

While exemplary embodiments of the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A method of forming a semiconductor apparatus, comprising:
    forming a substrate structure comprising a silicon substrate layer;
    forming an epilayer on the silicon substrate layer;
    forming an insulator layer on the epilyaer such that insulator layer is interposed between silicon substrate layer and the epilayer;
    forming a conductive through-substrate via extending through the silicon substrate layer;
    forming a conductive wall in the substrate structure, the conductive wall being in electrical contact with the silicon substrate layer and having an end that contact the insulator epilayer;
    forming a semiconductor device in the substrate structure; and
    forming a through-substrate via in the substrate structure and that is separated completely from the conductive wall, the through-substrate via formed on an opposite side of the conductive wall from the semiconductor device, the through-substrate via separated from the silicon substrate by an insulator.

2. The method of claim 1, wherein the conductive wall is formed prior to forming at least one of the semiconductor device and the through-substrate via.

3. The method of claim 1, wherein the conductive wall is formed to entirely surround the through-substrate via.

4. The method of claim 1, further comprising:
    forming the insulator on the silicon substrate layer;
    forming the semiconductor device in the insulator above the silicon substrate layer; and
    forming the conductive wall to extend through the insulator to contact the silicon substrate layer.

5. The method of claim 4, further comprising forming a buried oxide layer between the silicon substrate layer and the semiconductor device.

6. The method of claim 4, wherein forming the through-substrate via includes forming a hole in the silicon substrate layer from an upper surface of the silicon substrate layer, forming an insulator layer on the silicon substrate layer and sides of the hole, filling the hole with a conductive material, and planarizing a bottom surface of the substrate structure to expose the conductive material of the through-substrate via at the bottom surface of the substrate structure.

7. The method of claim 4, further comprising:
    forming an epilayer on the silicon substrate layer to have a conductivity greater than a conductivity of the silicon substrate layer,
    wherein the conductive wall is physically and electrically connected to the epilayer.

8. The method of claim 7, wherein the epilayer is doped more heavily than the silicon substrate layer.

9. The method of claim 8, wherein the epilayer is one of an N+ layer and a P+ layer.

10. A semiconductor apparatus, comprising:
    a substrate structure comprising a silicon substrate layer;
    a conductive through-substrate via extending through the silicon substrate layer;
    an epilayer on the silicon substrate layer;
    an insulator layer interposed between the silicon substrate layer and the epilayer;
    a semiconductor device located in the substrate structure; and
    a conductive wall that is separated completely from the conductive through-substrate via and is located between the through-substrate via and the semiconductor device, the conductive wall being in electrical contact with the silicon substrate and including a first end that contacts the epilayer.

11. The semiconductor apparatus of claim 10, wherein the conductive wall partially surrounds the through-substrate via.

12. The semiconductor apparatus of claim 10, wherein the insulator layer is located between the silicon substrate layer and the conductive through-substrate via,
    wherein the semiconductor device is located in the insulator layer above the silicon substrate layer.

13. The semiconductor apparatus of claim 12, further comprising a buried oxide (BOX) layer between the silicon substrate layer and the semiconductor device.

14. The semiconductor apparatus of claim 12, wherein the conductive wall contacts an upper surface of the silicon substrate layer.

15. The semiconductor apparatus of claim 12, wherein the silicon substrate layer includes a base silicon substrate layer and an epilayer on the base silicon substrate layer, the epilayer having a higher conductivity than the base silicon substrate layer,
    wherein the conductive wall is electrically connected to the epilayer.

16. The semiconductor apparatus of claim 15, wherein the epilayer is doped more heavily than the base silicon substrate layer.

17. The semiconductor apparatus of claim 16, wherein the epilayer is one of an N+ layer and a P+ layer.

18. A semiconductor circuit, comprising:
    a semiconductor apparatus comprising:
        a silicon substrate;
        a conductive through-substrate via extending through the silicon substrate;
        an epilayer on the silicon substrate;
        an insulating layer interposed between the silicon substrate layer and the epilayer;
        a semiconductor device located in the insulator layer above the silicon substrate; and
        a conductive wall that is separated completely from the conductive through-substrate via and is located between the through-substrate via and the semiconductor device, the conductive wall being in electrical contact with the silicon substrate, and having an end that contacts the insulator layer;
    at least one of a power source and a signal source connected to the through-substrate via; and
    a constant voltage source connected to the conductive wall.

19. The semiconductor circuit of claim 18, further comprising a semiconductor chip attached to a bottom side of the semiconductor apparatus and electrically connected to the through-substrate via.

20. The semiconductor circuit of claim 18, wherein the silicon substrate includes a base silicon layer and an epilayer on the base silicon layer between the base silicon layer and the semiconductor device, the epilayer being more conductive than the base silicon layer,
    wherein the conductive wall is electrically connected to the epilayer.

* * * * *